(12) United States Patent
Müller et al.

(10) Patent No.: US 6,246,302 B1
(45) Date of Patent: Jun. 12, 2001

(54) REACTANCE FILTER WITH SURFACE WAVE RESONATORS

(75) Inventors: Peter Müller, Pullach; Maximilian Pitschi, Rottach-Egern, both of (DE)

(73) Assignee: Siemens Matsushita Components GmbH & Co. KG, Munich (DE)

( * ) Notice: Subject to any disclaimer, the term of this patent is extended or adjusted under 35 U.S.C. 154(b) by 0 days.

(21) Appl. No.: 09/254,944

(22) PCT Filed: Aug. 28, 1997

(86) PCT No.: PCT/DE97/01875

§ 371 Date: Mar. 19, 1999

§ 102(e) Date: Mar. 19, 1999

(87) PCT Pub. No.: WO98/12806

PCT Pub. Date: Mar. 26, 1998

(30) Foreign Application Priority Data

Sep. 19, 1996 (DE) ................................................ 196 38 451

(51) Int. Cl.[7] ...................................................... H03H 9/64

(52) U.S. Cl. ...................... 333/195; 333/196; 310/313 B; 310/313 D

(58) Field of Search .................................... 333/193–196, 333/133; 310/313 R, 313 B, 313 C, 313 D

(56) References Cited

U.S. PATENT DOCUMENTS

| 4,146,808 | | 3/1979 | Laker et al. ...................... 310/313 B |
| 4,353,046 | * | 10/1982 | Hartmann .......................... 333/195 X |
| 4,616,197 | * | 10/1986 | Wright .............................. 333/195 X |
| 5,726,610 | * | 3/1998 | Allen et al. ........................... 333/133 |
| 5,729,186 | * | 3/1998 | Seki et al. ......................... 333/195 X |
| 5,986,524 | * | 11/1999 | Shimoe ............................. 333/196 X |
| 6,025,763 | * | 2/2000 | Morimoto ......................... 333/196 X |

FOREIGN PATENT DOCUMENTS

| 0 481 733 A1 | | 4/1992 | (EP) . |
| 0 652 637 A1 | | 5/1995 | (EP) . |
| 0 663 721 A1 | | 7/1995 | (EP) . |
| 2 286 304 | | 8/1995 | (GB) . |
| 5-129872 | * | 5/1993 | (JP) . |
| 9-153753 | * | 6/1997 | (JP) . |

* cited by examiner

*Primary Examiner*—Robert Pascal
*Assistant Examiner*—Barbara Summons
(74) *Attorney, Agent, or Firm*—Schiff Hardin & Waite

(57) ABSTRACT

A reactance filter, particularly in a branching circuit (ladder type), with surface wave resonators wherein omission weighted normal finger transducers are employed between reflectors such that the arrangement and plurality of the active fingers of the interdigital transducer are particularly formed for changing the capacitance relationship (static to dynamic capacitance) such that a narrow filter bandwidth is achieved.

16 Claims, 4 Drawing Sheets

REACTANCE FILTER WITH SURFACE WAVE RESONATORS

BACKGROUND OF THE INVENTION

1. Field of the Invention

The present invention is directed to a reactance filter with surface wave resonators having interdigital transducers arranged between reflectors wherein at least one of the interdigital transducers is formed as an omission weighted normal finger transducer.

2. Description of the Prior Art

It is known in this field of art to employ reactance filters for broad band systems. It is known to employ such filters for broadband systems, particularly as filters in branching circuits (ladder type). For obtaining narrowband filters, attempts have been made to employ electrode materials other than aluminum wherein metallization heights were reduced. The variation of substrate materials was also incorporated into such attempts.

An object of the present invention is to create a reactance filter of the type initially described that is formed as a narrowband filter, particularly in a branching circuit (ladder type).

SUMMARY OF THE INVENTION

The respective resonator, in particular of the present invention, is formed as a one-port resonator, wherein the capacitance ratio (static to dynamic capacitance) is particularly dimensioned such that due to the arrangement and plurality of the active fingers of the interdigital transducer, a narrow filter bandwidth is achieved. Further, an improved stop band level can be achieved by the finger arrangement of the interdigital transducer of each and every resonator.

Low insertion attenuations can be achieved given the formation of the reactance filter as a filter in a branching circuit (ladder type) since no power is transmitted over acoustic paths. Al or an Al alloy, for example AlCu alloy, can be utilized as the electrode material. A suitable substrate material is $LiTaO_3$ (36° rotated YX) or $LiTaO_3$ (X112.2° Y). Other traditional piezoelectric substrate materials also may be used such as $LiNbO_3$ which exhibits, for example, the section (64° rotated YX) or (YZ). The relative metallization height (metallization height/wavelength at the center frequency) of the electrodes preferably amounts to approximately 0.05 through 0.1, particularly 0.07 or 0.09. A relative 3 dB bandwidth of 1.6% is achieved given a filter in a branching circuit. Resulting therefrom is an advantageous utilization of the present invention in duplexers; particularly, cordless telephone duplexers. The minimal insertion attenuation that is achieved lies at approximately 2.5 dB.

The ratio of static to dynamic capacitance of the one-port resonators employed for the filter can be varied by employing omission-weighted normal finger transducers such that more narrowbanded filters in branching circuits can be realized than heretofore known.

Additional features and advantages of the present invention are described in, and will be apparent from, the Detailed Description of the Preferred Embodiments and the Drawings.

DETAILED DESCRIPTION OF THE PREFERRED EMBODIMENTS

Figure 2:
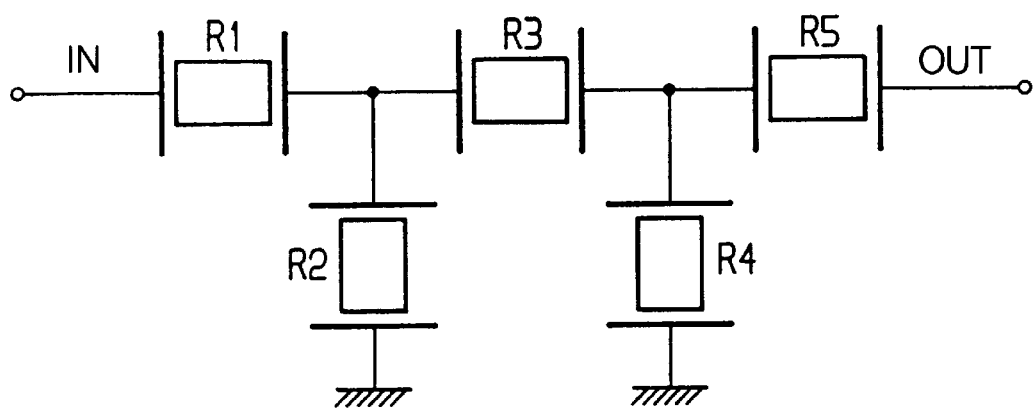
FIG. 2 shows a circuit diagram of a reactance filter in a branching circuit (ladder type) as an exemplary embodiment of the present invention.

As the exemplary embodiment of FIG. 2 shows, five one-port resonators R1 through R5 are connected to one another in a branching circuit. Three resonators R1, R3, R5 are connected in series to the signal path from the input to the output. Two resonators R2, R4 are connected parallel and lie between the series circuit and ground. The terminals of the two parallel resonators R2, R4 respectively lie between one of the two outer series resonators R1, R5 and the middle series resonator R3. The series resonators R1, R3 and R5 have the same capacitance relationships. The two parallel resonators R2, R4 have a higher capacitance relationship than the series resonators. The respective capacitance relationships can be achieved by suitable weighting. The two parallel resonators R2 and R4 may have the same capacitance relationship. Further, the middle series resonator R3 may contain a lower number of fingers than the two outer series resonators R1 and R5.

Figure 3:
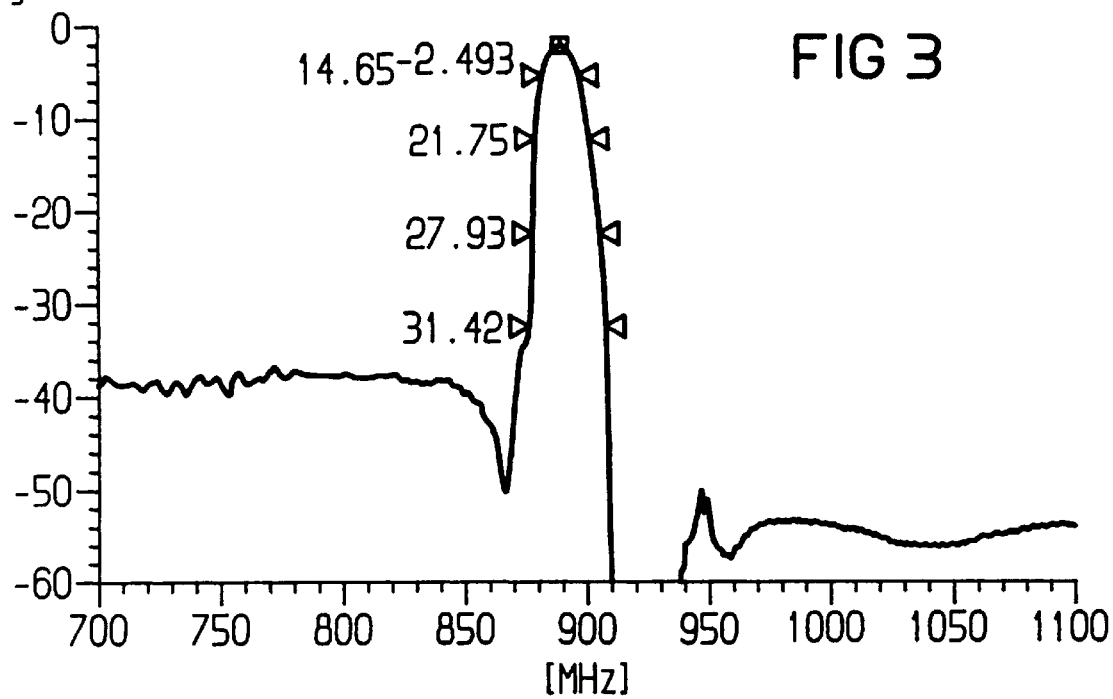
FIG. 3 shows a transfer function of the exemplary embodiment of FIGS. 1 and 2.

An improved selection of the reactance filter, compared to traditional filters, in the branching circuit is formed by a corresponding plurality of active groups, and their arrangement, as well as the number of fingers in view of a desired transfer function. The transfer function is shown in FIG. 3. The filter is self-matched to 50 Ω. The insertion attenuation amounts to approximately 2.5 dB. The relative 3 dB bandwidth amounts to approximately 1.6%. The relative metallization height amounts to 0.09.

Figure 1:
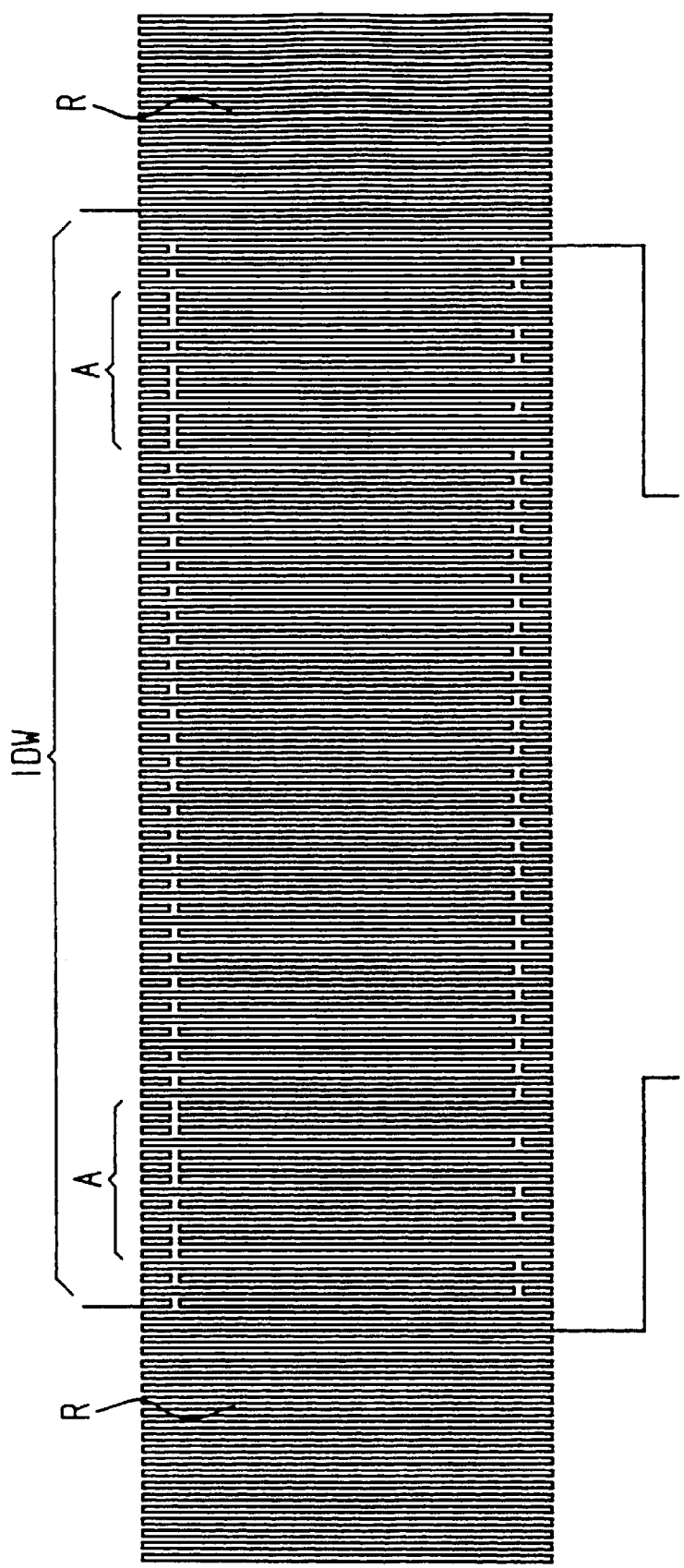
FIG. 1 shows the electrode layout of a resonator with omission-weighted normal finger transducers that is utilized in the exemplary embodiment of the present invention.

For explanation, FIG. 1 shows a one-port resonator that, standing for the one-port resonators R1–R5 (FIG. 2) employed, is shown for explaining the omission weighting. It can be seen from FIG. 1 that the omission weighting given the interdigital transducer IDW is particularly provided in the region of the two outer sections A of the interdigital transducer IDW. The interdigital transducer has a uniform structure in the central region therebetween. End reflectors R are provided for completion of the one-port resonator.

Figure 4:
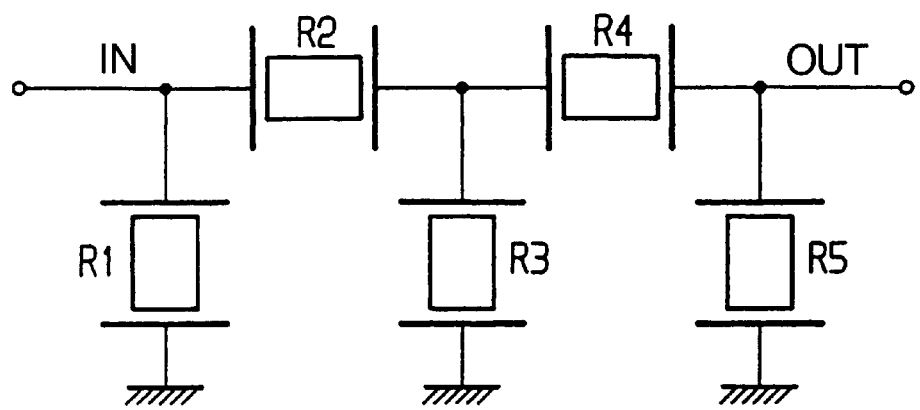
FIG. 4 shows a further exemplary embodiment of the present invention.

Given the exemplary embodiment shown in FIG. 4, two series resonators R2, R4 that are connected in series to the signal path from the input to the output are provided. Further, three parallel resonators R1, R3, R5 are provided. The one side of the resonator R1 is connected between the input and the first series resonator R2[sic]. The second parallel resonator R3 is connected between the two series resonators, and the third parallel resonator R5 is connected between the output and the second series resonator R4. The other sides of the parallel resonators are connected to ground potential.

The parallel resonators R1, R3 and R5 are unweighted given this embodiment of the filter in the branching circuit. The transducers of these resonators are uniform transducers.

The transducers of the series resonators R2 and R4 are weighted. Given the parallel resonators, the middle parallel resonator R3 may contain a lower number of fingers than the two outer parallel resonators R1 and R5.

Figure 6:
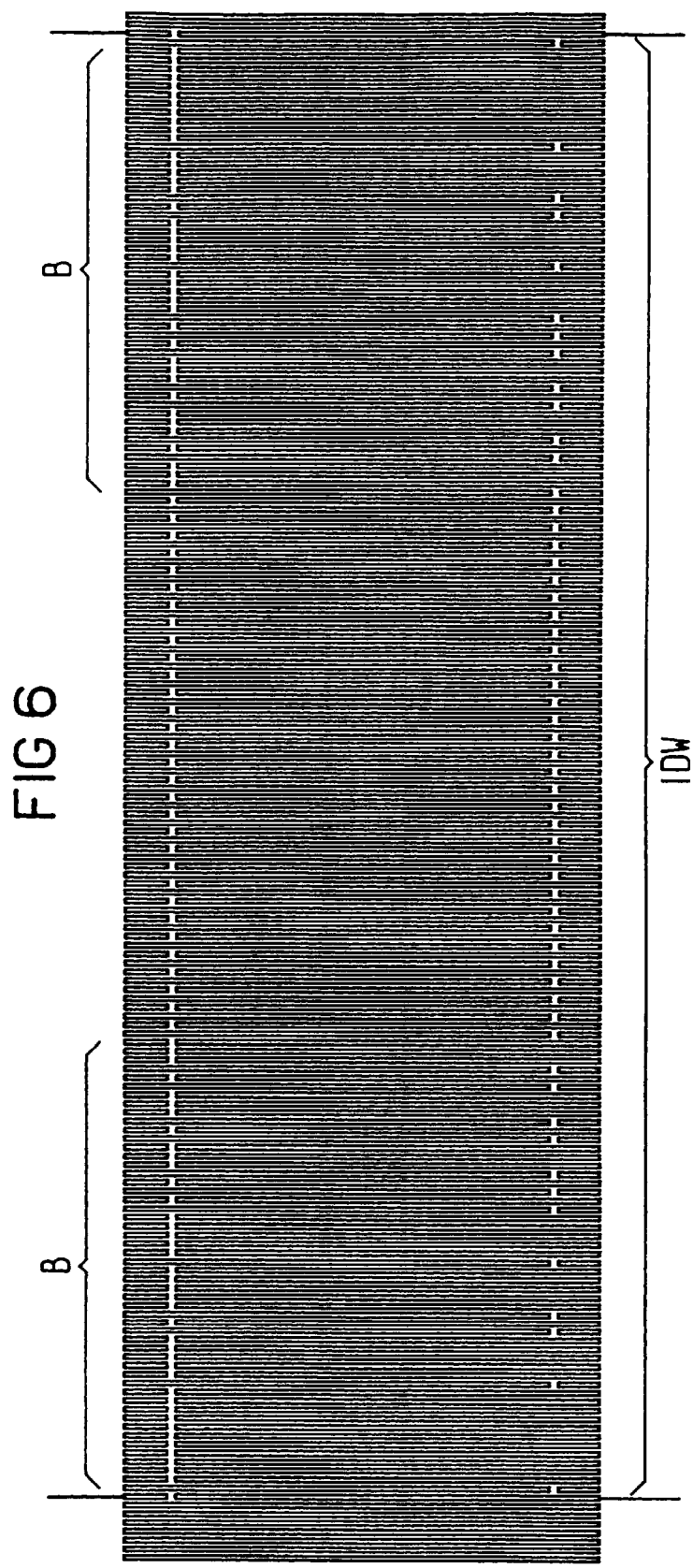
FIG. 6 shows a filter structure of an interdigital transducer that is employed in the exemplary embodiment of FIG. 4 given a weighted resonator.

FIG. 6 shows the finger structure of an exemplary embodiment for an omission weighted interdigital transducer IDW that can be employed given the weighted resonators R2 and R4 of FIG. 4. As can be seen from FIG. 6, sections having relatively high omission weighting are located in the outer end regions of the interdigital transducer, this gradually diminishing in the direction toward the middle of the transducer. The sections B [sic] are dimensioned longer than in the exemplary embodiment of FIG. 1. The transducer has a normal finger structure in its central region.

Figure 5:
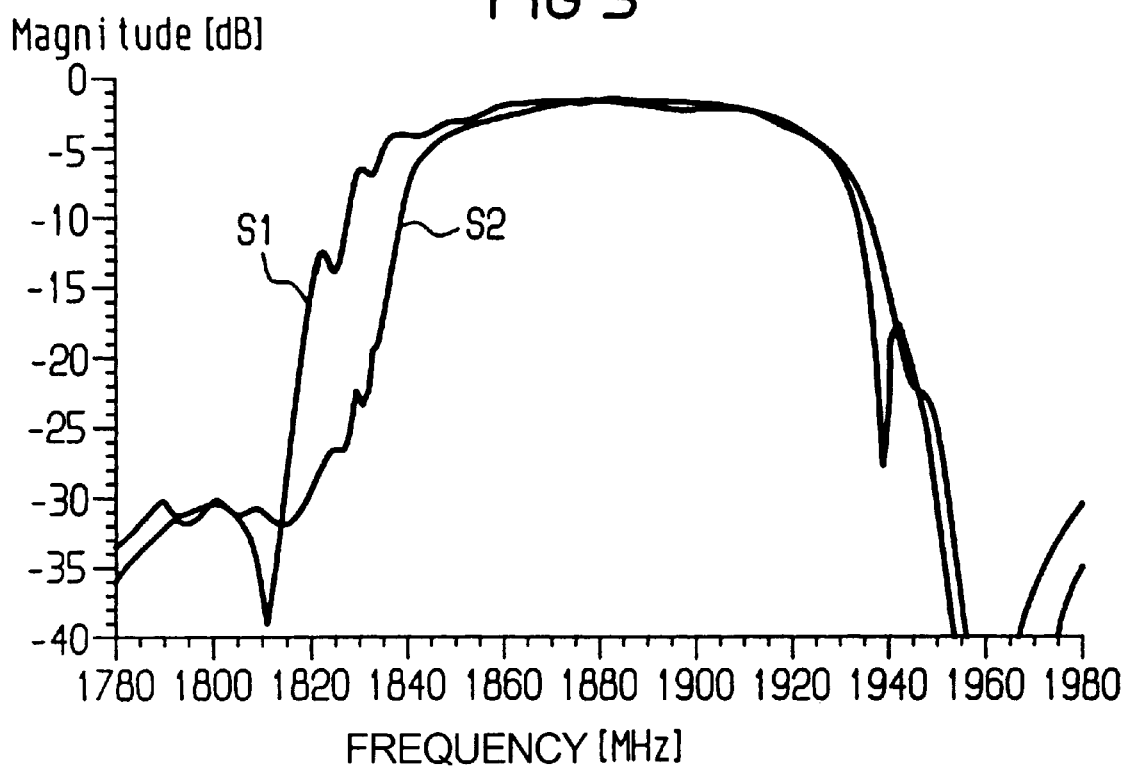
FIG. 5 shows transfer functions of a traditional filter and of the exemplary embodiment of the present invention from FIG. 4.

FIG. 5 shows the transfer function S1 of a traditional filter and the transfer function S2 of the exemplary embodiment shown in FIG. 4 having a relative metallization height of 0.07. It follows therefrom that an improved edge steepness in the right-hand transition region and a reduction of the bandwidth are achieved in the filter according to the present invention.

Although the present invention has been described with reference to specific embodiments, those of skill in the art will recognize that changes may be made thereto without departing from the spirit and scope of the invention as set forth in the hereafter appended claims.

What is claimed is:

1. A reactance filter, comprising: a plurality of surface wave resonators, each of the plurality of surface wave resonators including an interdigital transducer positioned between reflectors, wherein at least one of the interdigital transducers is formed as an omission weighted normal finger transducer, and wherein each interdigital transducer has a particular arrangement and number of active fingers for changing a capacitance relationship of static to dynamic capacitance wherein a narrow filter bandwidth is achieved.

2. A reactance filter as claimed in claim 1, wherein the omission weighted normal finger transducer includes two end sections in which omission weighting is provided.

3. A reactance filter as claimed in claim 1, wherein a substrate material of the plurality of resonators is $LiTaO_3$, particularly with a section (36° rotatedYX) or (X112.2° Y).

4. A reactance filter as claimed in claim 1, wherein a substrate material of the resonators is $LiNbO_3$, particularly with a section of (64° rotatedYX) or (YZ).

5. A reactance filter as claimed in claim 1, wherein the plurality of resonators are formed as one-port resonators.

6. A reactance filter, comprising: a plurality of surface wave resonators, each of the plurality of surface wave resonators including an interdigital transducer positioned between reflectors, wherein at least one of the interdigital transducers is formed as an omission weighted normal finger transducer, and wherein the plurality of surface wave resonators are connected to one another in branching circuit/ladder type form.

7. A reactance filter as claimed in claim 6, wherein three of the plurality of surface wave resonators are connected in series and two of the plurality of surface wave resonators are connected in parallel.

8. A reactance filter as claimed in claim 7, wherein the two outer series resonators have a weighting of the same size.

9. A reactance filter as claimed in claim 7, wherein the middle resonator of the three resonators connected in series has the same weighting as the two outer series resonators and has a lower number of fingers than the two outer series resonators.

10. A reactance filter as claimed in claim 7, wherein the two parallel resonators have a weighting of the same size.

11. A reactance filter as claimed in claim 7, wherein the parallel resonators are more highly weighted than the series resonators.

12. A reactance filter as claimed in claim 6, wherein two of the plurality of surface wave resonators are connected in series and three of the plurality of surface wave resonators are connected in parallel.

13. A reactance filter as claimed in claim 12, wherein the respective interdigital transducers include a weighting in end sections that decreases from outside to inside.

14. A reactance filter as claimed in claim 12, wherein only the series resonators have weighted interdigital transducers.

15. A reactance filter as claimed in claim 14, wherein electrode material of the plurality of resonators is Al or an Al alloy.

16. A reactance filter as claimed in claim 15, wherein a relative metallization height is approximately 0.05 through 0.1.

* * * * *